(12) United States Patent
Dowben

(10) Patent No.: US 9,799,815 B2
(45) Date of Patent: Oct. 24, 2017

(54) DOPED BORON CARBIDES AND THERMOELECTRIC APPLICATIONS

(75) Inventor: Peter Dowben, Lincoln, NE (US)

(73) Assignee: QUANTUM DEVICES, LLC, Rockville, MD (US)

( * ) Notice: Subject to any disclaimer, the term of this patent is extended or adjusted under 35 U.S.C. 154(b) by 750 days.

(21) Appl. No.: 13/604,927

(22) Filed: Sep. 6, 2012

(65) Prior Publication Data

US 2013/0233368 A1  Sep. 12, 2013

Related U.S. Application Data

(60) Provisional application No. 61/531,158, filed on Sep. 6, 2011.

(51) Int. Cl.
| | |
|---|---|
| *H01L 35/28* | (2006.01) |
| *H01L 35/30* | (2006.01) |
| *H01L 35/22* | (2006.01) |
| *B63G 8/08* | (2006.01) |

(52) U.S. Cl.
CPC ............... *H01L 35/22* (2013.01); *B63G 8/08* (2013.01); *H01L 35/28* (2013.01)

(58) Field of Classification Search
CPC .......... H01L 35/00; H01L 35/22; H01L 35/28
USPC ........................................ 136/205, 203, 239
See application file for complete search history.

(56) References Cited

U.S. PATENT DOCUMENTS

| | | | |
|---|---|---|---|
| 4,957,773 A | 9/1990 | Spencer et al. | |
| 5,298,084 A * | 3/1994 | Van Der Beck et al. | .... 136/230 |
| 5,468,978 A | 11/1995 | Dowben | |
| 5,623,119 A | 4/1997 | Yater et al. | |
| 5,658,834 A | 8/1997 | Dowben et al. | |
| 6,025,611 A * | 2/2000 | Dowben | ........................ 257/183 |
| 6,185,941 B1 * | 2/2001 | Watanabe et al. | ................ 62/3.7 |
| 6,440,786 B1 | 8/2002 | Dowben | |
| 6,600,177 B2 | 7/2003 | Dowben | |
| 6,771,730 B1 | 8/2004 | Dowben et al. | |
| 6,774,013 B2 | 8/2004 | Dowben et al. | |
| 7,368,794 B2 | 5/2008 | Caruso et al. | |
| 2002/0139123 A1 * | 10/2002 | Bell | ................................ 62/3.7 |
| 2005/0236028 A1 * | 10/2005 | Strnad | ........................... 136/201 |
| 2006/0032525 A1 * | 2/2006 | Olsen et al. | ................... 136/203 |
| 2006/0243317 A1 * | 11/2006 | Venkatasubramanian | .... 136/206 |

(Continued)

OTHER PUBLICATIONS

Werheit, Boron-rich solids: a chance for high-efficiency high-temperature thermoelectric energy conversion, Materials Science and Engineering B29 (1995) 228-232.*

(Continued)

*Primary Examiner* — Matthew Martin
*Assistant Examiner* — Dujuan Horton
(74) *Attorney, Agent, or Firm* — Steven B. Kelber

(57) ABSTRACT

A thermoelectric converter is provided where an n-type boron carbide element is paired with a p-type boron carbide element and placed between a eat sink and a high temperature are, such as the ocean in which a submarine operates, and the interior of that submarine, respectively. Boron carbide elements suitable for use in this invention are deposited from meta carborane (n-type) together with dopants to emphasize n-type character, such as chromocene, and orthocarborane, together with dopants to emphasize p-type character, such as 1,4 diaminobenzene to form the p-type element.

12 Claims, 2 Drawing Sheets

(56) References Cited

U.S. PATENT DOCUMENTS

2008/0223427 A1    9/2008  Ohno
2009/0044848 A1*   2/2009  Lashmore et al. ............ 136/201

OTHER PUBLICATIONS

Wood, Materials for thermoelectric energy conversion, Rep. Prog. Phys. 51 (1988) 459-539.*
U.S. Appl. No. 61/494,610, filed Jun. 8, 2011, Dowben, et al.
U.S. Appl. No. 61/531,158, filed Sep. 6, 2011, Dowben, et al.

* cited by examiner

DOPED BORON CARBIDES AND THERMOELECTRIC APPLICATIONS

PRIORITY DATA AND INCORPORATION BY REFERENCE

This application claims benefit of priority to U.S. Provisional Patent Application No. 61/531,158 filed Sep. 6, 2011 which is incorporated by reference in its entirety.

BACKGROUND OF THE INVENTION

Field of the Invention

This invention pertains to boron carbide materials and their preparation that are advantageously employed in thermoelectric applications. Although the boron carbide of the invention finds applications in both logic and spin applications, the particular environment to which the p and n-type boron carbide materials of the invention disclosed herein are particularly suited to thermoelectric converters and similar devices.

The boron carbide devices of this invention can be built on virtually any substrate, although conventional metal are preferred. As set forth in U.S. Pat. No. 7,368,794, incorporated herein-by reference, aluminum, nickel, gold, silver, copper or cobalt as convenient substrates may be used, once cleaned and then placed in a suitable chamber. Silicon may also be used as a substrate, and metal combinations with PMDA-ODA (Kapton).

Related Art

A great deal of attention has been focused on the formation of boron carbide, both doped and undoped, as a suitable material for use in semiconductor devices, particularly when mated with silicon. In U.S. Patent Application Ser. No. 61/494,610 also incorporated herein-by-reference, we disclose the provision of boron carbide based thin alloy films formed from UHV deposition. In the examples, copper was used as the substrate, but other substrates can be used. Orthocarborane and 1,4-diaminobenzene are introduced into the deposition chamber according to the details provided in the pending patent application. The deposited films are a characteristic of p-type semiconductors. Of particular importance for the application discussed herein, conductivities in these boron carbide alloy films are considerably higher than those encountered in conventional semiconducting boron carbide films. The UHV method also lends itself to the inclusion of relatively high amounts of dopant, by introduction into the chamber.

Other methods of forming boron carbide films on a useful substrate are known to those of skill in the art. In particular, U.S. Pat. Nos. 5,658,834, 5,468,978 and 4,957,773 all incorporated herein-by-reference, disclose the formation of boron carbide semiconductor films, and devices made thereby, from carborane precursors. In particular, the precursor carborane is preferably closo-1,2 orthocarborane, closo 1,7 metacarborane and closo 1,12 paracarborane. These boron carbide films are in general p-type films.

U.S. Pat. Nos. 6,025,611, 6,440,786 and 6,600,177, each of which is incorporated herein-by-reference, also describe the formation of boron carbide films, and importantly disclose that these films may be doped by incorporation of a suitable source material in the plasma chamber in which the plasma enhanced chemical vapor deposition of the boron carbide films occur. Although, as noted, boron carbide films prepared from orthocarborane sources are in general p-type materials, sufficient dopant (nickel in the examples) can be included in the formation gases to convert the boron carbide formed to an n-type material. Almost one percent (1%) nickel can be included before it precipitates in the formed film (forms aggregates or "clumps"). Other potential dopants, including chromium, manganese, iron, cobalt and ruthenium are discussed.

U.S. Pat. No. 6,771,730 is directed to a neutron detector, as is the principle application of previously discussed U.S. Patent Application Ser. No. 61/494,610. The entire disclosure of U.S. Pat. No. 6,771,730 is incorporated herein-by-reference. In this device, the boron carbide is formed as an electrically active component of the device, paired with a silicon component on which the boron carbide may be formed, the silicon being an n-type conductor and the boron carbide, as formed from orthocarborane sources, is a p-type layer. Both layers may be doped to accentuate their orientation.

In U.S. Pat. No. 6,774,013 the formation of naturally n-type boron carbide from the meta carborane (1,7-dicarbadodecarborane) is disclosed. The entire disclosure of U.S. Pat. No. 6,774,013 is incorporated herein by reference. To accentuate the n-type character of the boron carbide, plasma enhanced chemical vapor deposition may be used, which it is disclosed, makes the incorporation of n-type dopants, such as nickel, chromium, iron, cobalt and manganese further easily incorporated.

U.S. Pat. No. 7,368,794, also incorporated herein-by-reference, is directed to the formation of neutron detectors, and similar kinetic energy to electricity devices and that disclosure is incorporated herein by reference. In particular, this patent is directed to devices employing an n-type boron carbide and a p-type boron carbide as the two members forming a heteroisomer junction. Boron carbide, in particular, is particularly well suited to high temperatures and harsh conditions, where other semiconductors may fail. It is resistant to radiation damage. A variety of factors make it desirable to employ boron carbide where such conditions may be present.

Background of the Technology

Thermoelectric converters are well known. In this type of device, adjacent temperature extremes are converted into electricity pursuant to the Seebeck effect and thermoelectric cooling through the Peltier effect. In essence, if an n-type conductor and a p-type conductor are placed in electrical contact, and conductivity is high enough, if one face of the two materials is exposed to an elevated temperature while the other is exposed to a reduced temperature, the carriers in the semiconductors migrate, creating a current. A stylized illustration of a thermoelectric converter is set forth in FIG. 1. As those with skill in the art will recognize, this can be reconfigured as a power generator, as shown in FIG. 2.

U.S. Patent Publication 2008/0223427 describes a thermoelectric converter of particular structure where n-type semiconductors and p-type semiconductors are provided in electrical contact in holes of a ceramic honeycomb. As is well known, the current can be run in reverse, to achieve cooling rather than energy generation, in accordance with what is commonly referred to as the Peltier effect. The disclosure of U.S. Patent Publication 2008/0223427 is incorporated herein-by-reference. Exemplary semiconductors included in the system of this thermoelectric converter include $NaCoO_2$ and $ZnO$.

U.S. Pat. No. 6,185,941 describes an improved thermoelectric converter where the improvements come from the position of a first and second thermoelectric conductors positioned to contact only in a specific orientation. The disclosure of this patent is incorporated herein-by-reference. Conventional semiconductor materials are employed.

U.S. Pat. No. 5,623,119 describes a reversible thermoelectric converter specifically calling for the provision of two quantum well diodes physically separated but electrically connected coupled with a heat pump or refrigerator. The disclosure of this patent is incorporated herein-by-reference. Conventional metals are employed as the conductors.

SUMMARY OF THE INVENTION

The invention is directed to the generation of electrical current, or, in the reverse, cooling, by assembling at least one, and preferably two elements of boron carbide as the two elements of a thermoelectric converter. Where only one boron carbide element is provided, it is preferably n-type to be paired with a p-type semiconductor such as silicon. Advantageously, however, the two elements of the thermoelectric converter are both comprised of boron carbide, one being deposited as a p-type material and being further doped to augment the p-type character, and the other being deposited as an n-type element, and further doped to accentuate its n-character.

BRIEF DESCRIPTION OF THE DRAWINGS

The accompanying drawings, which are incorporated herein and constitute part of this specification, illustrate exemplary embodiments of the invention, and, together with the general description given above and the detailed description given below, serve to explain the features of the invention.

DETAILED DESCRIPTION

Figure 1:
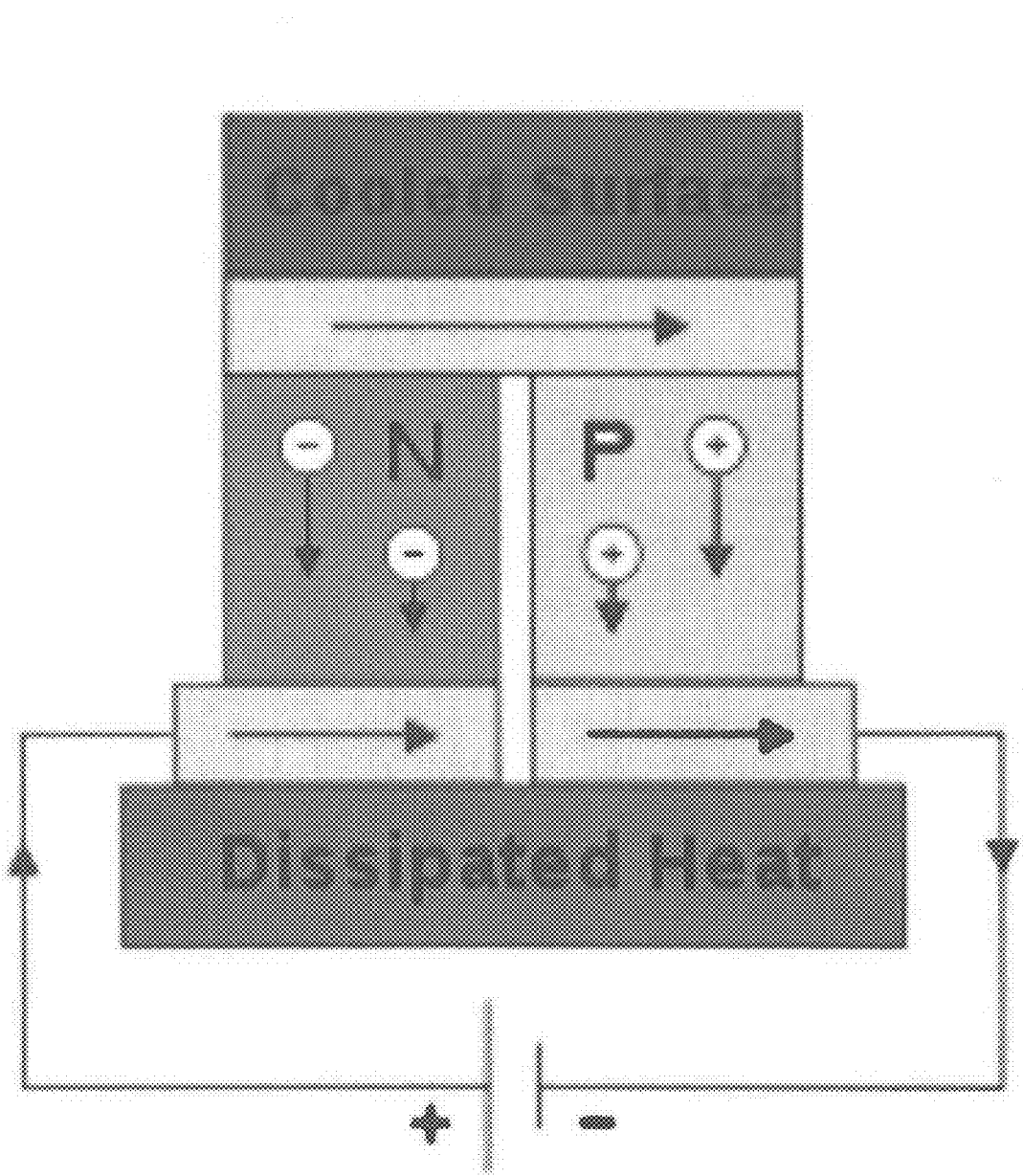
FIG. 1 is a schematic reflecting the basic thermoelectric converter of the claimed invention, with an n-type element coupled with a p-type element, sandwiched between one surface exposed to heat and the other exposed to cold. Thermoelectric conversion depends on a temperature difference between opposed surfaces of the n and p-type elements.
Figure 2:
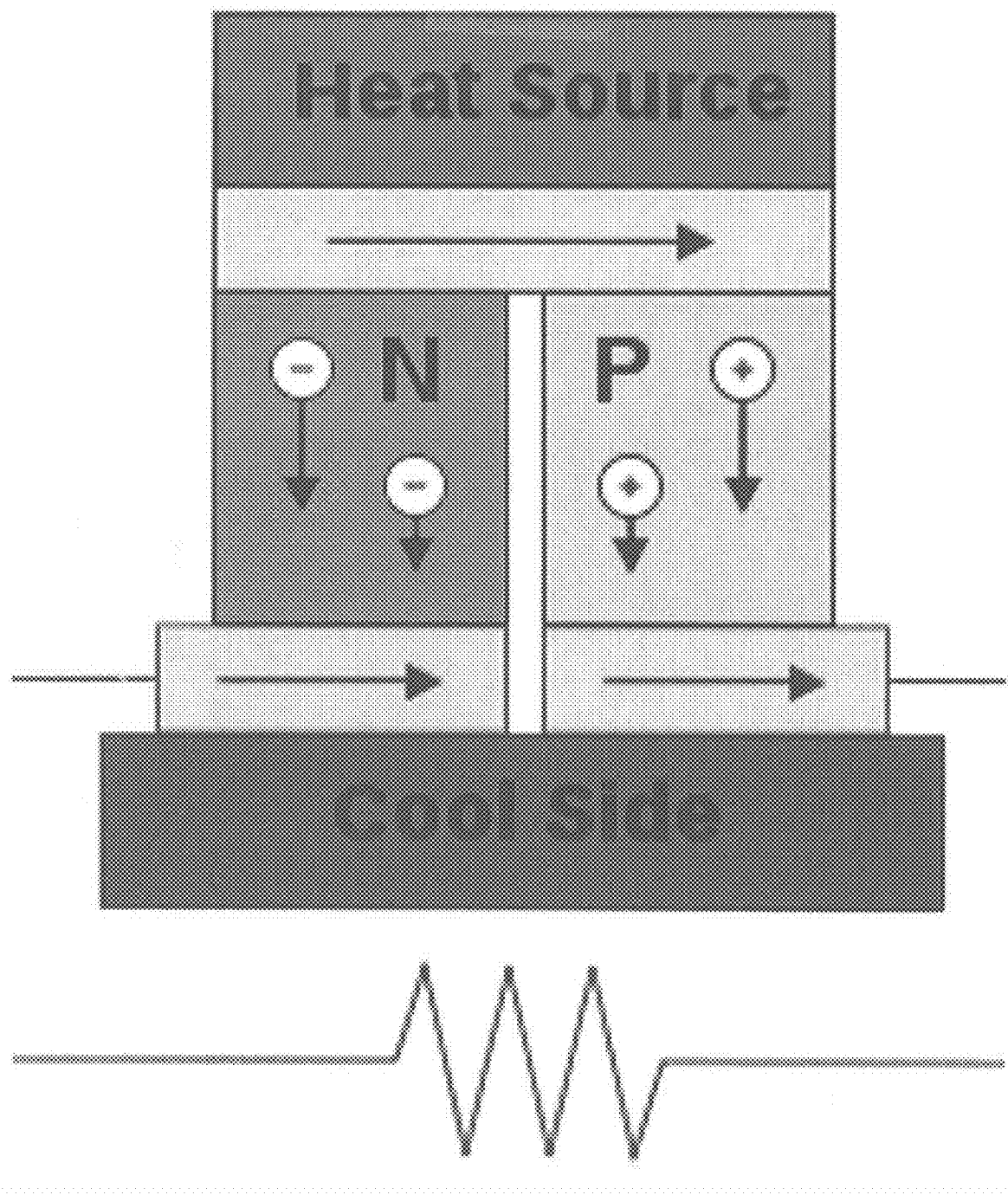
FIG. 2 is a schematic reflecting the same combination of n and p-type elements arranged together and electrically connected, but this time in the form of a generator

The invention of this application is a reversible thermoelectric motor. The structures and arrays of conventional thermoelectric motors can be employed. Those of ordinary skill in the art will recognize that to generate appreciable electric current, a plurality thermoelectric converters or cells are coupled across whatever temperature break is being exploited. The thermoelectric converters and motors of the patents discussed above can be employed, in terms of their structure and connections, or an alternate structure can be employed. In general, however, these thermoelectric converters are employed wherever there is a sharp temperature differential between a heat generator on one side, and a heat sink or cold well on the other.

One very common application for such converters is in submarines. The submarine generates lot of waste heat in the submarine—not only from its power generation, but from the individuals and activities within the submarine. Unchecked, the temperature generation within the submarine would quickly grow to intolerable levels. The submarine operates in an environment of a natural heat sink, however. The surrounding water is cold, often, as in the case of an ocean of significant depth, extremely cold. Below the thermocline, often encountered at about one thousand meters, temperatures fall rapidly to barely above freezing (2 to 4 degrees centigrade). This makes the hull of a submarine an ideal place to locate a thermoelectric converter. The extreme temperature gradient between the interior and the exterior offers the opportunity for substantial energy generation.

Another environment as hostile as the one encountered by submarines is outer space. Again, the interior of a space ship (such as a shuttle) or even something unmanned, such as an orbiting observation satellite, is hot in relative terms. Even the weakest ion engines of exploratory spacecraft generate heat. The surrounding environment of frigid outer space is hostile, and creates a sharp temperature variation. Because the thermoelectric converter of this invention preferably employs both an n and a p-type semiconductor of boron carbide, it is rugged and resistant to these harsh environments. With the added advantage that boron carbide will also afford the some protection to satellite and spacecraft from radiation like solar neutrons.

Run inverse, as a Peltier cooler, thermoelectric materials may have a wide application in computers and consumer electronics, to keep heating at a minimum and enhancing the power dissipation from IC chips.

There are other environments, where smaller temperature gradients are experienced. Even in a domestic home, but more commonly in an industrial plant, large quantities of heat are generated. Frequently these are coupled either with an ambient exterior atmosphere, or in some cases, air conditioned or even refrigerated areas. The boron carbide based thermoelectric device of this invention can be employed in just such a situation.

Whether employed in a subterranean, submersible or extra-atmosphere environment, a preferred thermoelectric converter is based on n and p-type elements that are paired together. Ideally, these elements share characteristic responses to temperature and radiation and corrosive agents. The thermoelectric converter of the invention, disclosed herein, advantageously employs at least one boron carbide element. In a preferred embodiment, both elements of the thermoelectric converter are made of boron carbide. Boron carbide deposited from meta carborane (1,7-dicarbadodecarborane) is naturally an n-type semiconductor. N-type characteristics can be enhanced by the addition of a dopant. Preferred dopants are Co, Ni, Fe, Mn or Cr. Although a lot of work has been done with nickel dopants, as noted, the maximum dopant level with nickel appears to be about one percent (1%). After that, precipitation occurs. In contrast, chromium, from chromocene, may be incorporated as a dopant in the boron carbide at levels up to at least four percent (4%). Chromium may also be introduced through sputtering during growth, and to a limited extent, by diffusion. Other dopants, such as ferrocene (for Fe), cobaltocene (for Co), managanocene (for Mn) may be employed.

Alternatively, to make the p-type boron carbide element, deposition using orthocarborane as the starting material provides a natural p-type semiconductor. These materials are also suitably doped to provide enhanced p-type characteristics. As set forth in U.S. Patent Application Ser. No. 61/494,610, 1,4 diaminobenzene co-deposited (co-condensed) with orthoborane and cross-linked with electron beam irradiation provides an alloy having the structural and chemical properties of boron carbide, with an enhanced p-type character. Azide dopants and oxygen appear to be equally effective as p-type dopants.

The two boron carbide elements of the thermoelectric converter of the invention are desirably formed through a single process, much as discussed in the preparation of the neutron detector of U.S. Pat. No. 7,368,794. In application to the thermoelectric converter of this invention, the first precursor introduced into the deposition chamber is either metacarborane, combined with chromocene or similar n-type dopant, or orthocarborane, combined with 1,4 diaminobenzene. Either the p-type or the n-type element may be deposited first. The remaining element follows.

The resulting thermoelectric converter is arrayed with multiple units of similar design and construction, and then deployed in or between the temperature variant being exploited. A rugged and dependable thermoelectric converter, resistant to extreme environments where conventional conductors fail, is accordingly provided. While the present invention has been disclosed both generically, and with reference to specific alternatives, those alternatives are not intended to be limiting unless reflected in the claims set forth below. The invention is limited only by the provisions of the claims, and their equivalents, as would be recognized by one of skill in the art to which this application is directed.

What is claimed is:

1. A thermoelectric converter element, which element generates electricity when a first surface of said element is exposed to a first set of temperature conditions, and a second surface of said element is exposed to a second set of temperature conditions;
   wherein said first and second set of temperature conditions are such that said first set of temperature conditions is warmer than said second set of temperature conditions;
   wherein said element comprises a layer of boron carbide n-type semiconductor doped with a dopant that enhances the n-type character of said doped n-type boron carbide, and said element comprises a layer of a p-type semiconductor; and
   wherein said layer of n-type semiconductor and said layer of p-type semiconductor are connected electrically in a circuit and wherein said thermoelectric converter element generates electricity while said first and second surfaces are exposed to said first set of temperature conditions and said second set of temperature conditions, respectively.

2. A thermoelectric converter, comprising a plurality of the thermoelectric converter elements of claim 1.

3. The thermoelectric converter element of claim 1, wherein said p-type semiconductor layer is comprised of materials selected from the group consisting of silicon, an alloy of orthocarborane and 1,4-diaminobenzene, and boron carbide.

4. The thermoelectric converter element of claim 1, wherein said dopant is selected from the group consisting of nickel, chromium, iron, cobalt, ruthenium and manganese.

5. The thermoelectric converter element of claim 3, wherein said p-type semiconductor is comprised of boron carbide.

6. The thermoelectric converter element of claim 5, wherein said p-type boron carbide is doped with a dopant which enhances its p-type character.

7. The thermoelectric converter element of claim 6, wherein said n-type dopant is selected from nickel, chromium, iron, cobalt and manganese.

8. A method of generating electricity, comprising exposing the thermoelectric converter of claim 2 to a temperature gradient;
   wherein said layer of boron carbide n-type semiconductor of each of said thermoelectric converter elements is exposed to a first temperature condition;
   wherein said p-type semiconductor of each of said thermoelectric converter elements is exposed to set second temperature condition; and
   wherein there is a sufficient absolute difference between said first temperature and said second temperature such that a current is caused to be generated in a circuit in which circuit said boron carbide n-type semiconductor and said p-type semiconductor are electrically connected.

9. The method of claim 8, wherein said p-type semiconductor is comprised of boron carbide.

10. The method of claim 8, wherein one of said first and second temperature condition is the inside temperature condition of a submarine and wherein the other of said first and second temperature condition is a sea in which said submarine is located.

11. The method of claim 8, wherein one of said first and second temperature condition is the inside temperature condition of a vessel in outer space and wherein the other of said first and second temperature condition is that of outer space in which said vessel is located.

12. The method of claim 8, wherein one of said first and second temperature condition is the inside temperature condition of a refrigerated enclosure and wherein the other of said first and second temperature condition is an ambient condition in an area in which said enclosure is located.

* * * * *